(12) United States Patent
Chitica (10) Patent No.: US 8,798,112 B2
(45) Date of Patent: Aug. 5, 2014

(54) HIGH SPEED LASING DEVICE (75) Inventor: Nicolae Pantazi Chitica, Kista (SE)

(73) Assignee: Tyco Electronics Svenska Holdings AB, Jaerfaella (SE)

( * ) Notice: Subject to any disclaimer, the term of this patent is extended or adjusted under 35 U.S.C. 154(b) by 0 days.

(21) Appl. No.: 13/489,017

(22) Filed: Jun. 5, 2012

(65) Prior Publication Data

US 2012/0307855 A1 Dec. 6, 2012

(30) Foreign Application Priority Data

Jun. 6, 2011 (EP) ...................................... 11168808

(51) Int. Cl.
*H01S 5/183* (2006.01)

(52) U.S. Cl.
USPC ................. 372/45.01; 372/46.013; 372/50.11; 372/50.124

(58) Field of Classification Search
USPC ....................................................... 372/45.01
See application file for complete search history.

(56) References Cited

U.S. PATENT DOCUMENTS

| | | | |
|---|---|---|---|
| 5,903,590 A | 5/1999 | Hadley et al. | |
| 6,365,427 B1* | 4/2002 | Gauggel et al. | 438/22 |
| 2001/0050934 A1* | 12/2001 | Choquette et al. | 372/43 |
| 2002/0031153 A1* | 3/2002 | Niwa et al. | 372/45 |
| 2002/0154675 A1* | 10/2002 | Deng et al. | 372/96 |
| 2004/0028103 A1 | 2/2004 | Ueki | |
| 2006/0093006 A1* | 5/2006 | Jikutani | 372/50.1 |
| 2006/0227836 A1 | 10/2006 | Omori et al. | |
| 2008/0069166 A1 | 3/2008 | Lee et al. | |
| 2008/0151961 A1 | 6/2008 | Kim et al. | |
| 2011/0116147 A1* | 5/2011 | Motomura et al. | 359/204.1 |

FOREIGN PATENT DOCUMENTS

EP   1480303 A2   11/2004

OTHER PUBLICATIONS

Search Report issued by the European Patent Office, Munich, Germany, dated Oct. 11, 2011, for Priority Application No. EP 11168808.1; 8 pages.
European Search Report in EP 11 168 808.1, dated Feb. 21, 2012, 17 pgs.
Communication from the European Patent Office in EP 11 168 808.1, dated May 22, 2012, 6 pgs.
Response to Communication in EP 11 168 808.1, dated Nov. 30, 2012, 13 pgs.

* cited by examiner

*Primary Examiner* — Xinning Niu
(74) *Attorney, Agent, or Firm* — Faegre Baker Daniels LLP

(57) ABSTRACT

The present invention relates to a lasing device for use in an optical module. The lasing device comprises a first reflector and a second reflector; a confinement layer adapted to confine current within a current-confining aperture; and an active layer between the first and second reflectors. The active layer comprises a main active region aligned with the current confining aperture and an auxiliary active region surrounding the main active region. The second reflector includes a first reflector region arranged on the current-confining aperture and a second reflector region surrounding the first reflector region. The second reflector region and the first reflector are configured to induce stimulated recombination in the auxiliary active region.

13 Claims, 4 Drawing Sheets

HIGH SPEED LASING DEVICE

BACKGROUND OF THE INVENTION

1. Field of the Invention

The present invention relates to lasing devices for use in high-speed fiber optical communication systems, and more specifically to Vertical Cavity Surface Emitting Lasers (VCSELs) with high modulation bandwidth. Moreover the present invention relates to optical interconnects including lasing devices with high modulation bandwidth. Finally, the present invention relates to a method for manufacturing high-speed lasing devices.

2. Related Art to the Invention

Lasing devices and in particular Vertical Cavity Surface Emitting Lasers commonly used in high-speed communication systems include a cavity sandwiched between two highly reflective mirrors or reflectors so as to form a resonator. The mirrors include several alternating layers of semiconductors of high and low refractive index and are doped with p-type and n-type dopants or impurities, respectively so as to form a p-n or a p-i-n diode junction. In a semiconductor laser the gain mechanism that generates the lasing is provided by light generation from the recombination of holes and electrons. The recombining holes and electrons are injected, respectively, from the p and n sides of the diode junction. In telecommunication applications, the recombination of carriers is generated by electrical pumping, i.e. by forward-biasing the diode junction. Commonly, the current in the lasing device is confined to an aperture of the laser by implanting ions into the lasing device structure everywhere except the aperture on the lasing device so as to increase the electrical resistivity of the material around the aperture. Alternatively, the current around the aperture of the lasing device can be inhibited by oxidizing the material around the aperture of the lasing device.

Semiconductor lasers are employed in telecommunication applications for building optical interconnects used in electronic devices. Such optical interconnects became in recent years widely used in electronic devices due their capability of supporting a much higher bandwidth than traditional cable interconnects. In this context, the development of optical modules for converting optical signals into electrical signals and vice versa plays a crucial role in a wide range of applications, such as mid-board applications using optical interconnects.

Semiconductor lasers, such as VCSEL, typically convey information according to two schemes. In the first scheme, the laser is maintained in a constant light-emitting state and the output intensity is modulated by means of an external modulator driven by an externally applied voltage. Since this first scheme requires a costly external apparatus, optical interconnects including VCSEL are generally directly modulated. Direct modulation involves changing the current input of the laser, or, in other words, modulating the current around the bias current so as to produce a time-dependent output in the optical intensity. Usually, the current is switched between two values, both larger than the threshold current of the device.

Figure 7:
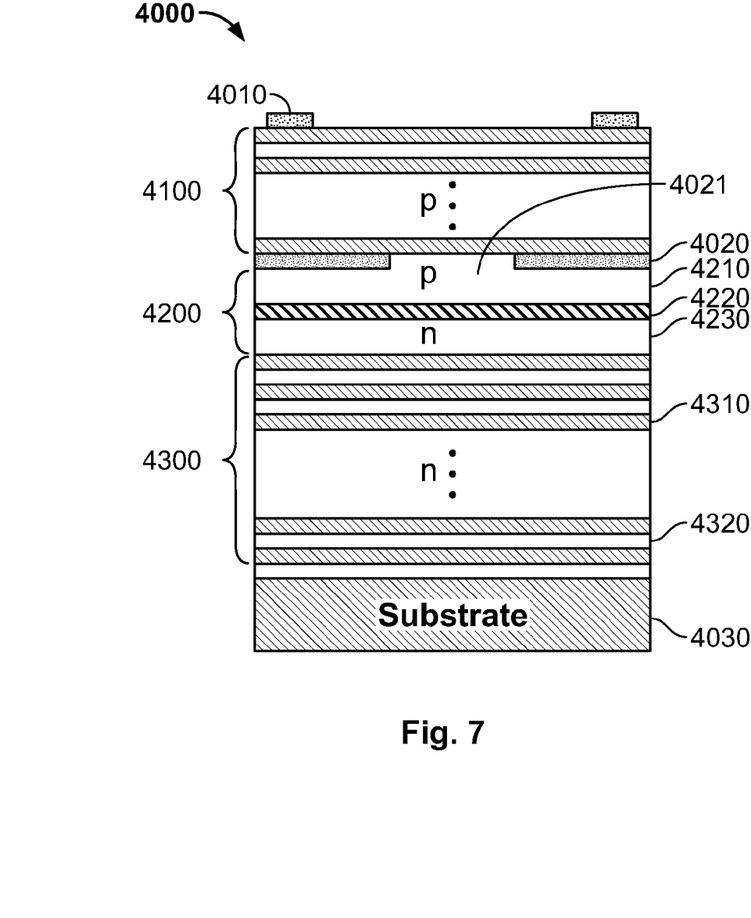
FIG. 7 shows a sectional view of a conventional lasing device according to the prior art.

FIG. 7 shows a lasing device 4000 according to the state of the art. The lasing device includes a substrate 4030 made of semiconductor material, a first mirror 4300 and a second mirror 4100. The first and second mirrors 4300 and 4100 respectively include a stack of alternating semiconductor mirror layers 4310, 4320. The layers 4310 have a high refractive index while the layers 4320 have a low refractive index. The first mirror 4300 is doped with n-type dopants, while the second mirror 4100 is doped with p-type dopants. The lasing device 4000 further includes a cavity spacer 4200 between the first and second mirrors 4300, 4100. The cavity spacer 4200 includes a first cladding layer 4230 and second cladding layer 4210 and an active layer 4220. Finally, the lasing device 4000 includes a current-confining region 4020 which defines a current-confining aperture 4021. The current-confining region is formed in the second cladding layer 4210 immediately below the second mirror 4100.

Figure 8:
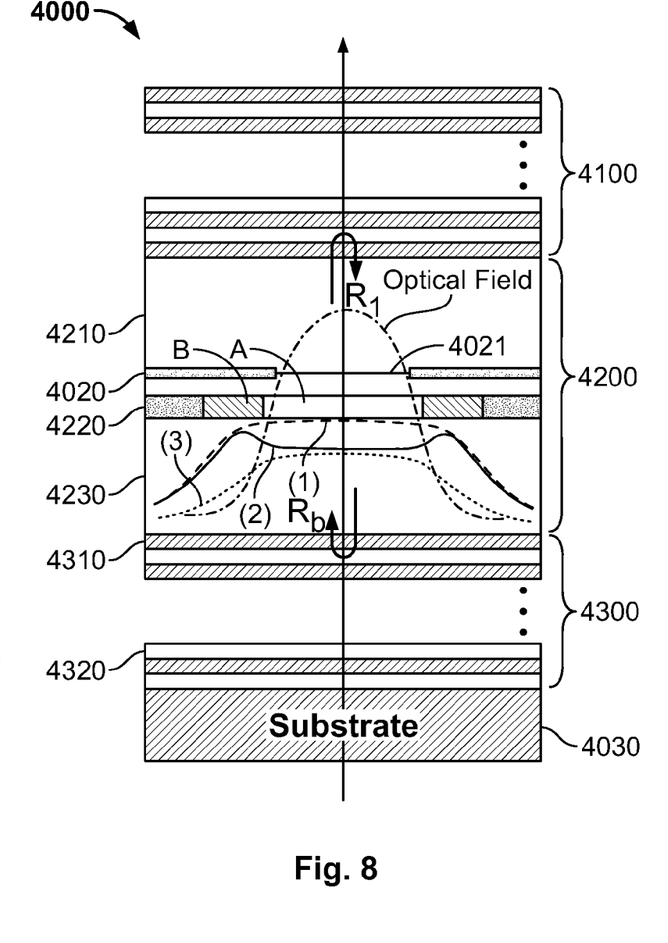
FIG. 8 shows the working principle of a common lasing device according to the prior art.

FIG. 8 is a schematic drawing illustrating the working principle of the lasing device 4000 of FIG. 7. In particular, FIG. 8 shows the effect of direct modulation on the carrier density in the active layer of the lasing device 4000. The current is switched between two values, both larger than the threshold current of the device. In the lasing device 4000, the carrier density is not perfectly clamped, but swings with the injection current due to gain saturation with optical field intensity and gain reduction due to internal heating.

FIG. 8 shows the distribution of the intensity of the optical field along the active layer 4220. As can be seen from the dashed line plot, the intensity of the optical field is maximum in the zone of the active layer corresponding to the current-confining aperture 4021. The optical field intensity is generally lower at the periphery and higher in the center of the active region. Moreover, in the peripheral regions of the active layer, optical loss is also higher than in the center of the active layer. This leads to a lower stimulated recombination rate at the periphery of the active layer. Upon switching from the high current level to the lower current level, the carrier density in the active layer 4220 will also switch from a high to a lower level. As can be seen from FIG. 8, at a particular bias current above the threshold, the carrier density distribution in the active layer 4220 is illustrated by the dotted curve (3). Zone A of the active layer 4220 indicates the area where the optical gain reaches the threshold value. Outside zone A, the carrier density is not sufficient for the generated gain to reach the threshold value. In addition, within zone A, the carrier density is not constant, but is larger where the local temperature and/or local photon density are higher.

FIG. 8 illustrates the particular case, in which the carrier density increases towards the center of the aperture.

At a higher bias current, both the temperature and the photon density in the active layer 4220 increase. Consequently, the carrier density in zone A will also increase in order to maintain the gain at the threshold value. At a higher bias current, the carrier density in the areas surrounding zone A will also increase and will become high enough to generate a gain that reaches the threshold value in a zone B surrounding zone A. This behaviour is illustrated by the dashed curve (1). Consequently, the active region of the laser where the carriers and photons are strongly coupled through stimulated recombination will expand from zone A at a lower bias to zones A and B at a higher bias current.

Upon switching from a high bias to a low bias, the carrier density in zone A of the active layer decreases at a much faster rate than the density in zone B of the active layer 4220 due to a stronger stimulated recombination in the areas with a higher optical field intensity. Thus, the carrier density will have two peaks at the periphery of the active layer 4220 as shown in the solid curve (2). These excess carriers in zone B of the active layer 4220 will act as a reservoir from which carriers will flow from the periphery towards the center of the active layer 4220, thereby acting as a capacitance connected parallel to the active layer of the laser. This extends the fall-time of the lasing device 4000 and negatively affects its response to a modulating signal. Consequently, the design of common lasing devices limits the modulation bandwidth and the high speed performance of optical interconnects employing the lasing device.

More precisely, since during the high-to-low transition, the laser 4000 evolves towards a lower carrier density and a reduced stimulated recombination rate the laser 4000 slows down in adapting to the new, lower current level, thereby enhancing the effect of the excess carrier density at the periphery of the active layer on extending the fall time. Even if the optical field intensity returns to its nominal value after a current waveform is applied, the carrier density will not, thereby leading to a dynamical coupling from the past to the future causing, for instance, inter-symbol interference.

In addition, in devices wherein current confinement is obtained by using a layer of insulation oxide 4020, the effective parasitic capacitance associated with the isolation oxide defining the current confining aperture is determined by the capacitance across the oxidized layer 4020 in series with the capacitance of the diode junction underneath the oxidized layer. If the diode is unbiased, the effective capacitance is given by the oxide layer capacitance in series with the depletion capacitance of the diode, the latest being the lowest of the two. Under forward bias the capacitance of the diode will increase while its series resistance will decrease leading to an overall increase of the effective capacitance of the structure. The maximum capacitance is only limited by the oxide capacitance, which is relatively large.

Lateral carrier spreading out from the aperture formed in the oxidized layer 4020 can be significant and in a steady-state, this will lead to a leakage current. The lateral carrier spreading will also provide some degree of forward bias to the outer regions of the diode structure under the isolation oxide 4020, thereby leading to an increase of the effective parasitic capacitance of the device with bias.

The above described effect further limits the modulation speed of the lasing device and hence the modulation bandwidth.

In order to overcome the problems associated with direct modulation of common lasing devices, many solutions have been proposed for reducing the effect of carrier spreading out towards the periphery of the active layer. In particular, clamping of the carrier density inside the active region could be improved through reduced gain saturation and internal heating. Alternatively, proton implantation or patterned tunnel junction techniques may be used to additionally confine the carriers so as to reduce the carrier density at the periphery of the active layer.

The known techniques have, however, the disadvantage that the additional confinement is effective only if the lateral geometry of the carrier confinement features matches the transversal distribution of the optical field. Developing a device with the above mentioned design requires extensive design and is very complex and costly to realize.

SUMMARY OF INVENTION

Therefore, the problem underlying the present invention is to provide a lasing device for use in directly modulated high-speed fiber optical communication systems, which can be driven at a high-modulation speed, which has a reduced effective parasitic capacitance, and which can be fabricated in a particularly simple and cost-effective manner and at the same time allows for a faster and more reliable fiber optical communication system.

This problem is solved by providing a laser structure including, at the periphery of the active layer of the main laser, an auxiliary laser having the function of a guard laser.

The guard laser will clamp the carrier density within its active region which overlaps the periphery of the active region of the main laser and further induce additional stimulated recombination at the periphery of the active region of the main laser.

The additional stimulated recombination will increase the rate at which the excess carrier density at the periphery of the active region decreases when the input current is switched down. In addition, the guard laser causes a reduction of the carrier injection in the outer region of the diode structure, thereby limiting the increase of the effective parasitic capacitance related to an oxide layer. Finally, the solution proposed in the present invention does not require using elaborated and costly techniques such as ion implantation or patterned tunnel junction.

According to a preferred embodiment the present invention provides a lasing device for use in an optical interconnect. The lasing device comprises a first reflector and a second reflector; a confinement layer adapted to confine current within a current-confining aperture, and an active layer between the first and second reflectors. The active layer comprises a main active region aligned with the current confining aperture and an auxiliary active region surrounding the main active region. The second reflector includes a first reflector region arranged on the current-confining aperture and a second reflector region surrounding the first reflector region. The second reflector region and the first reflector are configured to induce stimulated recombination in the auxiliary active region.

In this manner, although the periphery of the active layer is electrically isolated through the confinement layer and the carrier density is not clamped throughout the active layer, the excess of carriers that accumulates at the periphery of the main active region can be consumed by means of stimulated recombination induced by the second reflector region. Since the excess carriers at the periphery of the main active region are consumed by the additional stimulated recombination, the capacitive effect due to the flow of carriers from the periphery to the center of the main active region is suppressed.

According to a further advantageous development, the reflectance of second reflector region may be higher than the reflectance of the first reflector region. The higher reflectance of the second reflector region increases the intensity of the optical field at the periphery of the main active region and consequently the recombination rate of the carriers. Moreover, the higher reflectance of the second reflector region decreases the lasing threshold in the auxiliary active region. The higher recombination rate consumes the excess of carriers, thereby preventing the formation of a reservoir of carriers at the periphery of the main active region.

According to another development, the first reflector region is aligned with the current confining aperture and the area of the first reflector region is larger than the area of the current confining aperture. In particular, if the current confining aperture has a circular shape, also the first reflector region is chosen to be circular and the diameter D1 of the first reflector region is larger than the diameter D0 of the current confining aperture. In this case, the second reflector region is chosen to be ring-shaped with an inner diameter D2 that may be equal to or larger than the diameter D1 of the first reflector region.

In a further development a ratio $S_1/S_0$ between the area of the first reflector region and the area of the current confining aperture may be in the range from 1.0 to 3.3. The relation between the sizes of the current confining aperture and the first reflector region allows to control the coupling between the main laser and the guard laser, and consequently the effectiveness of the guard laser on reducing the capacitive effect of the excess carriers at the periphery of the main laser.

In a lasing device according to an advantageous realization of the invention, the first reflector and the second reflector respectively include at least one layer with high refractive index and one layer with low refractive index. The layers can be easily grown by standard techniques and the so obtained reflector has an optimal reflectance of above 99.5%.

A layer of the second reflector may be fabricated so as to be thicker in the second reflector region than in the first mirror region. The thickness of a topmost reflector layer of the second reflector may be chosen to be an odd-number of a quarter wavelength in the second reflector region and zero or an even number of a quarter wavelength in the first reflector region. In this manner the first reflector region and the second reflector region can be easily defined by simply performing a further step in the manufacturing process of a conventional lasing device.

In an alternative advantageous realization of the present invention, the second reflector may include a reflector element arranged on the second reflector region and adapted to increase the reflectance of the second reflector region. Accordingly, the reflectivity of the second reflector can be selectively adjusted so as to form the first and second reflector regions by growing or mounting an additional layer on top of the second reflector, without involving any etching and masking process.

In an embodiment of the present invention, the first reflector region, the main active region and the first reflector define a main laser, and the second reflector region, the auxiliary active region and the first reflector define an auxiliary laser.

The lasing device of the present invention may further include a first cladding layer and a second cladding layer. The first and second cladding layers sandwich the active layer there-between so as to form a cavity spacer. The length of the cavity spacer may be chosen so as to correspond to an integer number of half waves at the emission wavelength. The thickness of the cavity spacer defines the resonance and the emission wavelength.

According to a further development of the present invention the active layer includes a stack of a plurality of alternating quantum wells and barriers and a vertical confinement layer on either side thereof.

The lateral confinement layer may be arranged between the first reflector and the second reflector and may include an oxidized layer of semiconductor or an ion implanted region surrounding the current-confinement aperture.

According to a further advantageous development of the present invention, the first reflector region is disk-shaped and the second reflector region is ring-shaped.

An embodiment of the present invention relates to an optical module including the lasing device described above. The above described lasing devices have a reduced carrier density at the periphery of the active region and do not suffer of carries flowing back from the periphery towards the center of the main active region upon switching from high to low driving currents. Consequently, the optical module can be driven at high modulation speeds. Optical interconnects mounting said lasing devices can therefore be used in high-speed fiber optical communication systems having an increased modulation bandwidth.

A further embodiment of the present invention provides a method for forming a lasing device for use in an optical interconnect. The method includes forming a first reflector stack on a semiconductor substrate and a confinement layer. The confinement layer is adapted to confine current within a current-confining aperture. An active layer is formed on the first reflector stack, and comprises a main active region aligned with the current confining aperture and an auxiliary active region surrounding the main active region. A second reflector stack is formed on the active layer, and in the second reflector stack a first reflector region is arranged on the current-confining aperture. A second reflector region surrounding the first reflector region is further formed, wherein the second reflector region and the first reflector are configured to induce stimulated recombination in the auxiliary active region.

The accompanying drawings are incorporated into and form a part of the specification to illustrate several embodiments of the present invention. These drawings together with the description serve to explain the principles of the invention. The drawings are only for the purpose of illustrating preferred and alternative examples on how the invention can be made and used and are not to be construed as limiting the invention to only the illustrated and described embodiments. Further, features and advantages will become apparent from the following and more particular description of the various embodiments of the invention as illustrated in the accompanying drawings, in which like reference numbers refer to like elements and wherein:

DETAILED DESCRIPTION OF THE INVENTION

In the following description, for explanatory purposes, specific details are set forth in order to provide a thorough understanding thereof. However, it may be evident that the present invention can be practiced without these specific details. Furthermore, well known structures and devices are only described in a more general form in order to facilitate the description thereof.

In the following description the expressions "mirror" and "reflector" are used to indicate the stacks of semiconductor or dielectric layers defining the resonant cavity of the laser. Similarly the expressions "first mirror region" and "first reflector region" are used in the following with the same meaning; and the expressions "second mirror region" and "second reflector region" are used in the following with the same meaning. The expression "gain region" and "cavity spacer" indicate the semiconductor layers sandwiched between the reflectors of the lasing device.

The problem underlying the present invention is based on the observation that upon switching down the driving current in direct-modulated lasing devices, the carrier density will decrease at a much faster rate at the center than at the periphery of the active layer. This is due to the fact that in the areas with higher optical field intensity, i.e. the center of the active layer, stimulated recombination is stronger. Accordingly, an excess of carriers accumulates in the periphery of the active layer, which acts as a carrier reservoir, and a lateral redistribution of carriers from the periphery towards the center of the active layer can take place. During a high-to-low transition, the laser evolves toward a lower photon density and a reduced recombination rate. This will enhance the effect of the excess carrier density at the periphery of the active layer, thereby extending the fall time of the lasing device. Moreover, lasing devices using an oxide semiconductor layer for confining the current in the device may suffer from lateral carrier spreading, resulting in a leakage current and an increase of the effective parasitic capacitance of the device with bias.

According to the present invention, the modulation of the carrier distribution at the periphery of the active layer is reduced by implementing an auxiliary laser, or guard laser, at the periphery of the main laser. The guard laser will clamp the carrier density within its active layer and consume the excess carriers at the periphery of the active layer of the main laser through stimulated recombination. In addition, the guard laser will reduce the carrier injection in the outer regions of the diode structure forming the lasing device, thereby limiting the increase of the effective parasitic capacitance related to the oxide layer.

Figure 1:
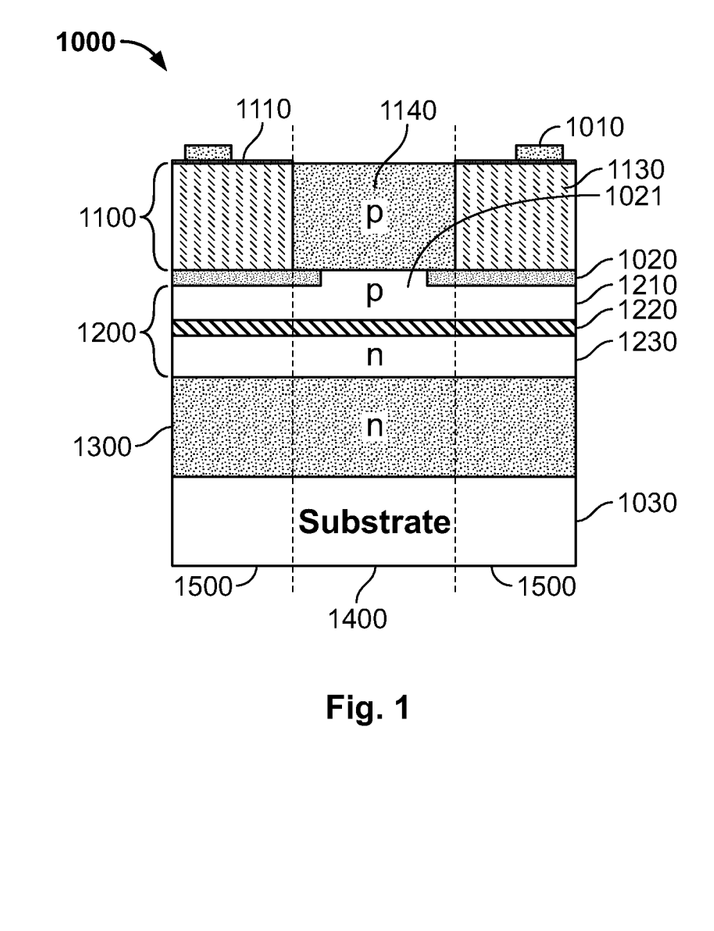
FIG. 1 shows a sectional view of a lasing device according to a first embodiment of the present invention.

FIG. 1 illustrates a sectional view of a lasing device designed according to the principles of the present invention. The lasing device 1000 comprises a substrate 1030 of semiconductor material on top of which a first reflector or mirror 1300 is formed. The first reflector 1300 may be any semiconductor material with a high reflectivity. A cavity spacer 1200 is further provided on top of the first mirror 1300. The cavity spacer 1200 includes a first cladding layer 1230 and a second cladding layer 1210 which are doped with opposite conductivity types. An active layer 1220 is sandwiched between the first and second cladding layers 1230 and 1210. The active layer 1220 is made of an intrinsic semiconductor and is the layer in which recombination of carriers occurs when the laser is driven by electrical or optical pumping. A closer description of the gain region 1200 is given with reference to FIG. 4.

The lasing device 1000 further includes a confinement layer 1020, which defines a current confining aperture 1021. The confinement layer 1020 is a layer of oxidized semiconductor material or oxidation layer. The oxidation layer 1020 is generally obtained by growing a high content aluminum semiconductor layer within the lasing device 1000 and further oxidizing the layer. The oxidized portion is electrically non-conductive and also has a lower refractive index, which also provides some degree of confinement for the optical field generated in the active layer 1220. The current confining aperture 1021 is a non-oxidized portion of the oxidation layer 1020. The current and the optical field generated by forward biasing the lasing device 1000 are mostly confined within the current-confinement aperture 1021.

A second reflector 1100 is formed on top of the current confinement layer 1020. The first and second mirrors or reflectors 1300 and 1100 are doped with impurities so as to have opposite conductivity types and form a diode junction. The second mirror 1100 and the second cladding layer 1210 are p-type, while the first mirror 1300 as well as the first cladding layer 1230 are n-type. The active layer 1220 includes one or more layers of an intrinsic semiconductor.

According to the structure in FIG. 1, the lasing device 1000 is a p-i-n diode junction. However, other configurations different from the described one may be used according to the particular application of the lasing device 1000. Further, in an alternative realization, the first and second mirrors 1300, 1100 may be intrinsic semiconductors or dielectric and p-type and n-type semiconductor layers may be buried between the first and second mirror 1300, 1200, to provide electrical connection to the active layer 1220.

The second mirror 1100 includes a first mirror region 1140 and a second mirror region 1130 surrounding the first mirror region 1140. The reflectance of the second mirror region 1130 R2 is selected to be higher than the reflectance R1 of the first mirror region 1140. The first mirror region 1140 is formed in the second reflector 1100 above the current-confining aperture 1021. The area of the first mirror region 1140 is larger than the area of the current confining aperture 1021 and also partially overlaps a portion of the oxidation layer 1020 immediately surrounding the current confining aperture 1021. However, in other preferred realizations of the present invention the first mirror region 1140 may be chosen to have the same size as the current-confining aperture 1021, or a smaller size.

The first and second reflector regions 1140, 1130 may be obtained by adding a top reflector 1110 on the top surface of the second mirror 1100. The top reflector 1110 may be a distributed Bragg reflector made of dielectric layers of alternate high and low refractive indices, a metal reflector, or a combination thereof.

Upon forward biasing the lasing device 1000 holes and electrons will respectively move from the p-doped layer 1210 and the n-doped layer 1230 to the active layer 1220. Recombination of holes and electrons injected into the active layer 1200 from the p and n sides of the p-i-n junction produces emission of light. The first and second mirrors 1300 and 1100 between which the active layer 1220 is sandwiched form together with the cavity spacer 1200, a resonant cavity in which the light is reflected before being emitted from the lasing device 1000.

The first mirror region 1140, the portion of the cavity spacer 1200 corresponding to the area of the first mirror region 1140 and arranged there-below, and the first dielectric mirror 1300 define a main laser 1400, which emits light with wavelengths depending on the energy gap of the semiconductor materials used for fabricating the lasing device 1000 and on the thickness of the cavity spacer. Similarly, the second mirror region 1130 surrounding the first mirror region 1140, the portion of the cavity spacer 1200 below it and the first dielectric mirror 1300 define an auxiliary laser 1500, or guard laser. The guard laser 1500 surrounds the portion of the lasing device 1000 defining the main laser 1400. The portion of the active layer 1220 surrounding the current confining aperture 1021 and arranged below the second mirror region 1130 is isolated through the oxidation layer 1020. Therefore, holes can not be injected directly from the p-type mirror into said portion of the active layer. Instead, carriers leak from the center of the active region 1220, which corresponds to an active region of the main laser 1400 into the periphery of the active region 1220, which corresponds to the active region of the auxiliary laser 1500. In other words, the recombining carriers of the auxiliary laser 1500 are injected from the center of the active layer 1220. Details of the active layers and on the different regions of the active layer will be given with reference to FIG. 5.

The carrier density in the center of the active layer 1220 corresponding to the first mirror region 1140 at and above the threshold current generally depends on the threshold gain in the active layer and thus on the reflectance of the dielectric mirrors 1100 and 1300. Generally, the carrier density at the threshold is inversely proportional to the reflectance of the electric mirror 1100 and 1300 of the lasing device. In the lasing device of the invention, the reflectance R2 of the second mirror region 1130 is higher than the reflectance of R1 of the first mirror region 1140. This configuration provides for a lower threshold carrier density of the auxiliary laser 1500. A more detailed description of the design of the main and auxiliary lasers 1400, 1500 and the corresponding active layers will be given with reference to FIG. 5.

In vertical cavity surface emitting lasers the reflectivity of the mirror 1300 is in the range of about 99.5 to 99.9%. This value can be lower in case of edge emitting lasers.

The details regarding the working principle of the lasing device 1000 also apply to all the other embodiments of the present invention as described in FIGS. 2 to 5.

The lasing device 1000 of FIG. 1 further includes first terminal contacts 1010 arranged on the top surface of the second mirror 1100 and second terminal contacts arranged on the bottom surface of the substrate (not shown).

Figure 2:
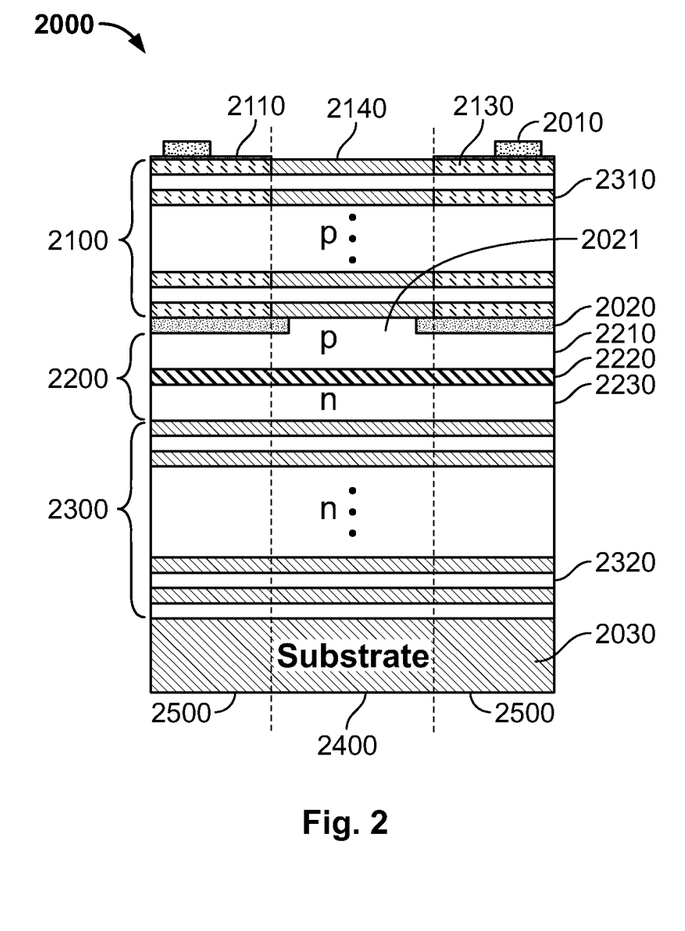
FIG. 2 shows a sectional view of a lasing device according to a further embodiment of the present invention.

FIG. 2 shows a further embodiment of a lasing device 2000 according to the present invention. The lasing device 2000 includes a substrate 2030, a first mirror 2300, a cavity spacer 2200 including a first cladding layer 2230 and second cladding layer 2210 doped with opposite conductivity types, a second mirror 2100 and a current confinement layer 2020 sandwiched between the second cladding layer 2210 and the second mirror 2100. The first mirror 2300 and the second mirror 2100 are doped so as to achieve opposite conductivity types. In particular, the first reflector 2300 and the first cladding layer 2230 are doped with n-type dopants and the second reflector 2100 and the second cladding layer 2210 are doped with p-type dopants. The current-confining layer 2020 includes a current-confining aperture 2021.

The second mirror 2100 includes a first mirror region 2140 corresponding to the current confinement aperture 2021. The area of the first mirror region 2140 is larger than the area of the current-confining aperture 2021 and may partially extend over the portion of the current confinement region 2020 immediately surrounding the current confining aperture 2021.

In an advantageous example, the ratio between the area S1 of the first mirror region 2140 and the area S0 of the current confinement aperture 2021 may be about 1.4. The above value is not universal and may change depending on the particular design of the lasing device. More precisely, the optimum ratio S1/S0 may be chosen based on the details of the particular realization, for instance, on the number of quantum wells and the composition of the quantum wells and barrier layer, and the actual reflectance of the first and second reflectors. The optimum ratio may be conveniently found by direct experimentation. As an example, several devices with first mirror regions having different areas S1 may be processed on one substrate, such as a semiconductor wafer. The optimum design may be found by direct measurement of parameters such as the threshold current, differential efficiency and modulation bandwidth, and/or the rise and fall times of the optical signal generated when a modulated current is applied to the device. For many practical configurations commonly used in telecommunication applications the ratio S1/S0 may be advantageous chosen in the range of 1.0 to 3.3.

In one particular configuration, the current confining aperture 2021 as well as the first mirror region 2140 may have a circular shape. In this case the diameters D0 and D1 of the current confining aperture and the first mirror region may be used as parameters. Accordingly, the ratio between the outer diameter D1 of the first mirror region 2140 and the diameter D0 of the current-confining aperture 2021 may be 1.2. Also in this case, the optimum ratio D1/D2 depends on the details of the particular realization, for instance, on the number of quantum wells and the composition of the quantum wells and barrier layer, and the actual reflectance of the first and second reflectors. The optimum ratio may be conveniently found by direct experimentation. As an example, devices with several different D1 values may be processed on one substrate. The optimum design may be found by direct measurement of parameters such as the threshold current, differential efficiency and modulation bandwidth, and/or the rise and fall times of the optical signal generated when a modulated current is applied to the device. For many practical configurations it may be advantageous to explore a range of 1.0 to 1.8 for the ratio D1/D0.

The current confinement region 2020 may be an oxidation layer as described with reference to FIG. 1 or may be obtained by ion, for instance proton, implantation in the cladding layer 2210. As an example, if the current confinement region is obtained by implantation, ions such as hydrogen ions and the like, may be implanted in the structure of the lasing device, for instance in the cladding layer 2210, everywhere except the current-confining aperture 2021. Ion implantation destroys the lattice structure around the aperture, thereby inhibiting the current flow through this region.

In another alternative embodiment, current confinement may be obtained by a patterned tunnel junction. Finally, first terminal contacts 2010 are arranged on the top surface of the mirror 2100 and second terminal contacts (not shown) are arranged on the bottom surface of the substrate 2030.

The working principle of the lasing device 2000 is the same as the working principle of the lasing device 1000 and will not be explained again.

The first and second mirrors 2300 and 2100 are distributed Bragg reflectors (DBR) structures. The first mirror 2300 includes a stack of a first layer 2320 and a second layer 2310 with alternating high and low refractive indices. Each of the first and second layers 2320 and 2310 has a thickness of a quarter of the laser wavelength in the material. The layer composition of the first mirror 2300 according to the above design yields an intensity reflectivity in the range of 99% to 99.9%. Similarly, the second mirror 2100 also includes a stack of a first layer 2320 and a second layer 2310 of alternating high and low refractive indices. In a preferred realization of the present invention, the first and second mirrors 2300, 2100 include 30 and 21 pairs of layers 2310, 2320, respectively. However, this configuration is not limiting and the first and second mirrors 2300, 2100 may include any number of layers, such as 22 layers for the second DBR 2100 and 34 layers for the first DBR 2300.

Although in the particular embodiment of FIG. 2, the mirrors are made of distributed Bragg reflectors, the first and second mirrors of the lasing device 2000 may also be obtained by other means, such as using a thin metal-film arranged in a doped semiconductor layer and the like.

The second reflector 2100 includes a first mirror region 2140 and a second mirror region 2130. The second mirror region 2130 has a higher reflectance than the first mirror region 2140. This can be obtained by adding a top reflector 2110 on the top surface of the second mirror 2100. The reflector 2110 may be an additional distributed Bragg reflector made of semiconductor or dielectric layers of alternate high and low refractive indices, a metal reflector, or a combination thereof.

Alternatively, the second mirror region 2130 can be obtained by modifying one or more of the second layers 2310 forming the second mirror 2100 by growing only part of the structure, patterning said structure and growing more layers or adding dielectric layers.

Still, in another embodiment, the second mirror region 2130 may be obtained by modifying one or more of the second dielectric layers 2310 forming the second mirror 2100 by converting the semiconductor layer in a similar way to the oxide aperture.

The shape of the additional reflector 2110 depends on the shape of the first mirror region 2140 and on the design of the current-confining aperture 2021. More precisely, the additional reflector 2110 is designed so as to surround the first mirror region 2140. In the embodiment of FIG. 2, the current-confining aperture 2021 has a circular shape, in which case the second mirror 2130 and the additional reflector 2110 have a ring-shaped section. However, the proposed solution and the discussion thereof also apply to devices having current confining apertures, first mirror regions and second mirror regions of any shape.

The first mirror region 2140, the portion of the gain region or cavity spacer 2200 corresponding to the area of the first mirror region 2140 and arranged below it, and the first mirror 2300 define a main laser 2400, which emits light having one or several wavelengths depending on the energy gap of the semiconductor materials used for fabricating the lasing device 2000 and on the thickness of the cavity spacer 2200. Similarly, the second mirror region 2130 surrounding the first mirror region 2140, the portion of the cavity spacer 2200 below it and the first mirror 2300 define an auxiliary laser 2500 or guard laser. The guard laser 2500 surrounds the portion of the lasing device 2000 defining the main laser 2400.

In FIG. 2 the arrangement of the main and auxiliary lasers in the lasing device 2000 is illustratively indicated by the vertical dashed lines. In particular, the region between the two dashed lines identifies the main lased 2400, whereas the region of the lasing device extending externally of the dashed lines identifies the auxiliary laser 2500. The same illustrative delimitation is used for the embodiments of FIGS. 1 and 3.

Figure 3:
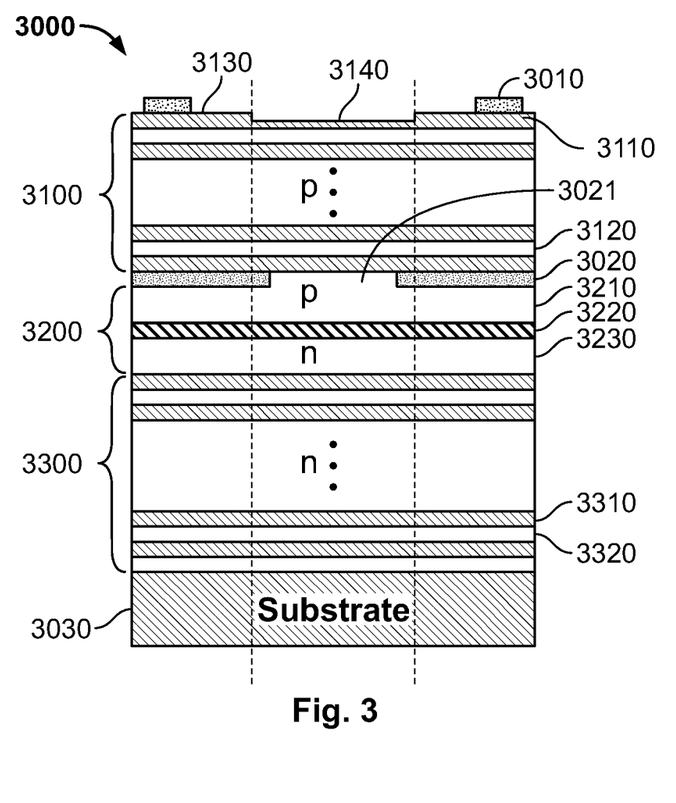
FIG. 3 shows a sectional view of a lasing device according to a further embodiment of the present invention.

FIG. 3 shows a sectional view of a lasing device 3000 according to a further embodiment of the present invention. The lasing device 3000 of FIG. 3 includes all the parts already described with reference to FIG. 2. In particular, the lasing device includes a first and a second mirror 3300, 3100, a first and a second cladding layer 3230, 3210, a current confinement layer 3020 and an active layer 3220. The first mirror region 3140, the portion of the cavity spacer 3200 corresponding to the area of the first mirror region 3140 and arranged there-below, and the first mirror 3300 define a main laser 3400, which emits light with one or several wavelengths depending on the energy gap of the semiconductor materials used for fabricating the lasing device 3000 and on the thickness of the cavity spacer 3200. Similarly, the second mirror region 3130 surrounding the first mirror region 3140, the portion of the cavity spacer 3200 below it and the first mirror 3300 define an auxiliary laser 3500 or guard laser. The guard laser 3500 surrounds the portion of the lasing device 3000 defining the main laser 3400.

Alternative to the embodiment of FIG. 2, a top layer 3110 of the mirror 3100 has a modified thickness in the region corresponding to the first mirror region 3140. More precisely, the second mirror 3100 is a DBR reflector including a stack of alternating layers of high refractive index 3110 and low refractive index 3120. The thickness of these layers is an odd number of a quarter of the laser wavelength in the semiconductor material, said thickness providing the highest reflectance for the DBR stack. The DBR 3100 is terminated with a high refractive index layer 3110. The thickness of this topmost dielectric layer 3110 is modified so as to be an even number of a quarter of the laser wavelength in the semiconductor material. The even number of a quarter wavelengths causes an anti-phase condition of the DBR reflector, thereby minimizing the reflectance of the layer stack. In this embodiment, the first mirror region 3140 is therefore realized by reducing the thickness of the topmost layer 3110 of the second DBR reflector along the region corresponding to the main laser 3500.

The lasing devices 1000, 2000 and 3000 according to the present invention are designed based on a stack made of Gallium Aluminum Arsenide and Gallium Arsenide (GaAlAs/GaAs) and can emit light with a wavelength in the range of approximately 650 nm to 1,300 nm. In particular, the embodiments described in the present invention emit light with a wavelength around 850 nm. However, these devices may also be designed to emit light at other wavelengths, such as 980 nanometers or 1,060 nanometers.

The lasing devices of FIGS. 2 and 3 may be vertical Cavity Surface Emitting Lasers (VCSELs). The design of these VCSELs is based on a stack made of Ga(1-x)AlxAs layers. The first and second mirrors 2300, 2100 and 3100, 3300 are distributed Bragg reflectors (DBRs), which use layer pairs with alternating composition to provide the desired reflectance. The cavity spacer 2200, 3200 is also Ga(1-x)AlxAs where x is varied in order to provide desired electrical transport and confinement characteristics. The active layer 2220, 3220 includes a number of GaAs quantum wells (not shown) with Ga(1-x)AlxAs barriers (not shown). A more detailed description of the cavity spacer 2200, 3200 will be given with reference to FIG. 4. In an alternative embodiment, the active layer 2220, 3220 may include strained Ga(1-x)InxAs quantum wells with Ga(1-x)AlxAs barriers. This solution is particularly advantageous in high performance VCSELs, since the Ga(1-x)InxAs semiconductor material ensures a better performance and a higher reliability.

As a concrete example, the second DBR 2100, 3100 may be p-doped and the first DBR 2300, 3300 may be n-doped. The substrate 2030, 3030 may be n-doped GaAs. The cavity spacer 2200, 3200 is designed as a separate confinement structure and may be a layer of Ga(1-x)AlxAs with graded x. As an example x may be in the range from 0.3 to 0.9. The active layer 2220, 3220 may consist of 3 Ga(1-x)InxAs quantum wells, wherein x may be in the range from 5 to 10%, with Ga(1-x)AlxAs barriers, wherein x is in the range from about 30 to about 40%. On the p-side of the lasing device 2000, 3000 between the second DBR mirror 2100, 3100 and the cavity spacer 2200, 3200 is provided an oxidation layer 2020, 3020. The oxidation layer 2020, 3020 is a thin Ga(1-x)AlxAs layer with a higher x in the range from 0.96 to 0.98 and is partly oxidized from the outer periphery inwards in order to form the current-confining aperture 2021, 3021. The oxidized portion of the oxidation layer 2020, 3020 is electrically non-conductive and it also has a lower refractive index which may also provide some degree of confinement for the optical field.

In an alternative embodiment, the oxidation layer 2020, 3020 may also be arranged in the second DBR reflector 2100, 3100 or in the cavity spacer 2200, 3200 in a position above the active layer 2220, 3220. In yet a further embodiment, besides the oxidation layer 2020, 3020 a second oxidation layer (not shown) may be provided between the first DBR mirror 2300, 3300 and the cavity spacer 2200, 3200, or within the first DBR mirror 2300, 3300, or in the cavity spacer 2200, 3200 in a position below the active layer 2220, 3220.

Commonly, the oxidation layer 2020, 3020 and the resulting current-confining aperture 2021, 3021 is placed in the p-doped side of the lasing device 1000, 2000, 3000. This configuration generally gives a better current confinement as compared to placing just one aperture on the n-side. In particular, the layer is between the p-DBR 2100, 3100 and the cavity spacer 2200, 3200 or in one of the first pairs of the p-DBR 2100, 3100, closest to the spacer 2200, 3200. However, many other configurations such as having several apertures on the p-side or on both the p- and n-sides can be used. The various configurations aim at improving current confinement, reducing parasitic capacitance and optimizing the transverse confinement of the optical field.

In the lasing devices 1000, 2000, 3000 depicted in FIGS. 1 to 3, the area of the current-confining aperture 1021, 2021, 3021 is smaller than the area of the first mirror region 1140, 2140, 3140 defining the main laser 1400, 2400, 3400 and thus it is smaller than the inner dimension of the ring defining the second mirror region 1130, 2130, 3130. The relation between the diameter of the current-confining aperture 1021, 2021, 3021 and the inner diameter of the guard ring 1130, 2130, 3130 dictates the coupling interaction between the main laser 1400, 2400, 3400 and the guard-ring or auxiliary laser 1500, 2500, 3500. In order to achieve the desired effect, the portion of active layer 1220, 2220, 3220 corresponding to the main laser 1400, 2400, 3400 and the auxiliary laser 1500, 2500, 3500 and the optical fields of the main laser 1400, 2400, 3400 and of the auxiliary laser 1500, 2500, 3500 should have some degree of overlap.

Moreover, in the configuration presented, the guard-ring laser 1500, 2500, 3500 operates exploiting the carriers leaking out of the active region of the main laser.

If the inner diameter of the guard ring 1130, 2130, 3130 is made larger, the coupling is reduced and the carrier density at the periphery of the main laser may swing more with the applied modulation, while still being relatively clamped within the active region of the guard laser 1500, 2500, 3500. Consequently, the guarding will be less effective. Also, as the inner diameter of the ring is made larger, the carrier density in the portion of the active layer 1220, 2220, 3220 of the guard laser will be effectively lower. If the carrier density is less than the threshold value, the guard laser will not lase and the guarding effect will be lost.

On the other hand, if the inner diameter is made too small, the guard ring will consume a significant fraction of the carriers injected in the device. This is effectively a loss mechanism that will reduce the efficiency of the main laser, generally leading to a degraded performance. In an extreme case, the guard laser may take over, turning off the main laser, by, for instance, consuming a too large fraction of the carriers injected into the device. The optimum ratio between the diameter of the first reflector region and the diameter of the current-confining aperture depends on the particular realization of the invention as explained herein. Also, as already explained herein, the optimum ratio may be conveniently found by direct experimentation. The optimum ratio between the outer diameter D1 of the first mirror region 3140 and the diameter D0 of the current-confining aperture 3021 will be in the range of 1.0 to 1.8 for many practical realizations.

The relation between the sizes of the current confining aperture, the first reflector region and the second reflector region controls the coupling between the main laser and the guard laser, thereby the effectiveness of the guard laser on reducing the capacitive effect of the excess carriers at the periphery of the main laser. In particular, for a circular current confining aperture, the coupling between the main and the guard lasers is controlled by the relation between the diameters D0, D1 and D2. In a preferred configuration, the inner diameter D2 of the second reflector region is equal to the diameter D1 of the first reflector region. In this particular configuration, the coupling between the main and the guard lasers is controlled by the ratio between D1 and D0.

For a confining aperture having a particular diameter D0, reducing the diameter D1 of the first reflector region will provide a stronger coupling between the guard laser and the main laser and a more effective reduction of the capacitive effect of the excess carriers. At the same time, reducing D1 will lead to a larger fraction of the carriers injected into the device being consumed by the guard laser thereby increasing the carrier loss from the main laser, leading, in turn, to a higher threshold current and lower efficiency of the main laser. As one can understand, there is a trade-off between reducing the effect of the excess carriers by the guard laser and carrier loss from the main laser. The optimum ratio between the diameter of the first reflector region and the current-confining aperture depends on the particular materials and overall design of the device. For common practical situations, the optimum ratio D1/D0 is in the range of 1.0-1.8.

Figure 4:
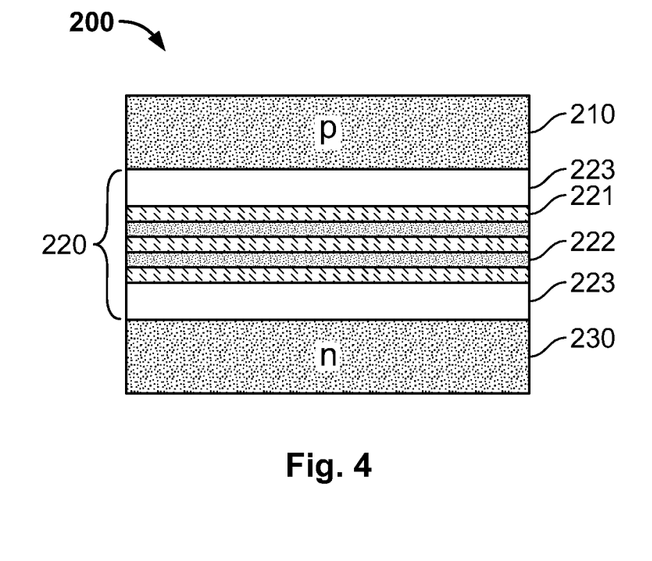
FIG. 4 shows a particular of the laser cavity used in the lasing device of FIGS. 1 to 3 according to a preferred embodiment of the present invention.

However, as the invention can be applied to devices realized in a wide variety of material combinations and with other specific design parameters covering relatively wide ranges, the optimum ratio may be outside this range for some particular realizations. For instance, the current confining aperture and the first mirror region may be not circular but rather have a different shape. In this case, the area S1 of the first mirror region 3140 and the area S0 of the current confinement aperture 3021 may be chosen as parameter. The value of the ratio S1/S0 may be chosen in the range from 1.0 to 3.3, as already explained with reference to FIG. 2. Advantageously, the ratio S1/S0 may be 1.4. FIG. 4 schematically shows a section of a cavity spacer 200 used in the lasing devices 1000, 2000 and 3000. The cavity spacer 200 includes a first cladding layer 230 and a second cladding layer 210. The cladding layers 230, 210 are made of semiconductor material and are doped such as to achieve opposite conductivity types. In the particular embodiment of FIG. 3, the first cladding layer 230 is doped with donors (n-type), whereas the second cladding layer 210 is doped with acceptors (p-type). The cavity spacer 200 further includes an active layer 220 sandwiched between the first and second cladding layers 230, 210.

The active layer 220 comprises a plurality of layers of an intrinsic semiconductor material. More precisely, the active layer 220 includes a stack of alternating quantum wells 221 and barriers 222. As described above, the quantum wells 221 consist of a layer of $Ga(1-x)In_xAs$, wherein x is in the range of 5% to 10%, while the barriers 222 include a layer of $Ga(1-x)Al_xAs$, wherein x is in the range of ca. 30% to 40%.

Although FIG. 4 shows an active layer including three quantum wells 221 and two quantum well barriers 222, this configuration should not be considered to be limiting. More precisely, the active layer 200 may include any number of quantum wells 221 and quantum well barriers 222 depending on the particular application of the lasing device 1000, 2000, 3000.

The active layer 200 further includes two intrinsic confining layers 223 sandwiching the stack of quantum wells and barriers 221 to 222. The confining layers 223 are arranged between the quantum wells 221 and the cladding layers 210, 230 and may be graded.

Figure 5:
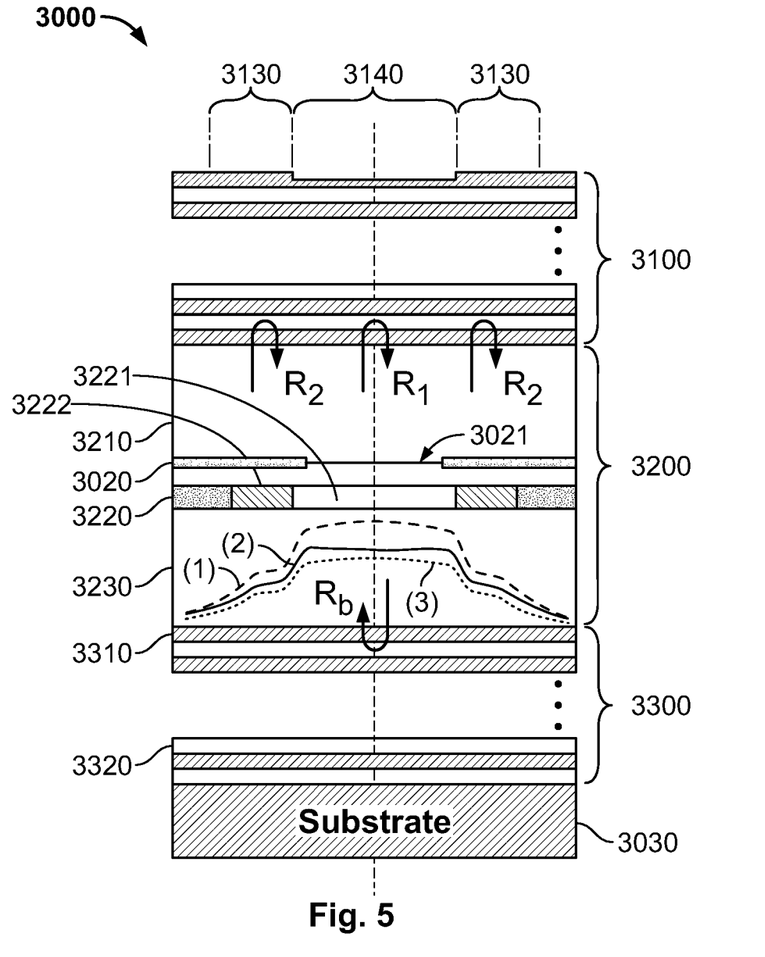
FIG. 5 schematically shows the working principle of a lasing device according to a preferred embodiment of the present invention.

FIG. 5 is a schematic picture illustrating the working principle of a lasing device according to the present invention. Although FIG. 5 refers to the embodiment in FIG. 3, the principles introduced and described with reference to FIG. 5 hold also true for the embodiments described in FIGS. 1 and 2.

FIG. 5 shows in particular the carrier density in the active layer 3220 depending on the forward bias applied to the lasing device 3000. Curve (1) shows the carrier density at a high current level corresponding to the high state of the lasing device 3000. Curve (3) shows the carrier density at a lower current level, while curve (2) shows the carrier density shortly after switching the current from the higher to the lower level.

In an ideal laser at a bias above threshold, the carrier density in the active layer is clamped at the threshold carrier density. Clamping of the carrier density is a direct effect of the coupling of the optical field (photon density) and the carrier density in the active layer through stimulated recombination of carriers and stimulated emission of photons. The carrier density generates sufficient amplification of the optical field to compensate for the total optical loss of the resonator. Any increase in the carrier density above the threshold value results in a gain that exceeds the total loss and leads to a rapid increase of the photon density and the stimulated recombination rate. This process restores the threshold level by consuming the excess of carriers.

In the lasing device 3000 of FIG. 5, as the current increases above the threshold value, the carrier density in the active layer 3220 is not perfectly clamped, but continues to increase in order to compensate for gain reduction as the temperature increases due to internal heating. Another factor that leads to an increase of the carrier density is the increase of the photon density or the intensity of the optical field generated in the lasing device 3000. Any excess carrier density that would result in a gain exceeding the optical losses is effectively consumed through mainly stimulated recombination.

FIG. 5 shows different zones included in the active layer 3220. More precisely, holes are injected through the current-confining aperture 3021 from the p-type cladding layer 3210 into zone 3221 when the lasing device 3000 is forward biased. Zone 3221 indicates the active region of the main laser 3400 or main active region. The optical field intensity has a maximum at the center of zone 3221. Therefore, the carrier density in the main active region 3221 is more responsive to changes in the bias current due to the stronger stimulated recombination caused by higher optical field intensity.

Zone 3222 surrounds zone 3221 and is shielded by the current-confining layer 3020. Zone 3222 indicates the auxiliary active region. Due to the layer 3020, direct injection of carriers from the cladding layer 3210 into the auxiliary active region 3222 is suppressed. Therefore, the auxiliary active region 3222 mainly includes carriers that leaked from the main active region 3221. Since the second mirror region 3130 of the second mirror 3100 has a higher reflectivity than the first mirror region 3140 defining the main laser 3400, the rate of stimulated recombination in the auxiliary active region 3222 is increased as compared to a device of a conventional design. This has the effect of limiting the increase of carrier density in the auxiliary active region 3222, which corresponds to an active region of the auxiliary laser 3500.

In this manner, upon switching from a high voltage value to a low voltage value, there will be no excess of carriers at the periphery of the active region of the main laser 3400, thereby suppressing the lateral redistribution of carriers from the periphery towards the center of the active layer 3220, which causes a capacitive effect in the laser.

The emitting wavelength of the guard laser or auxiliary laser 1500, 2500, 3500 depends on the semiconductor material of the lasing device 1000, 2000, 3000, on the energy gap of the semiconductor in the active layer 1220, 2220, 3220 and on the thickness of the cavity spacer 1200, 2200, 3200. The guard laser 1500, 2500, 3500 emits at a wavelength, which is very close to the wavelength of the main laser 1400, 2400, 3400. This solution is easier to implement and more cost effective, since the same semiconductor material can be used for the main and auxiliary lasers. However, the guard laser does not need to emit light at the same wavelength as the main laser and the principles and ideas of the present invention also apply to lasing devices, wherein the guard laser emits at a different wavelength as the main laser.

Further, both the main and guard lasers 1400, 1500, 2400, 2500, 3400 and 3500 may have a multi-mode emission containing several closely spaced wavelengths. The different resonator geometry as well as carrier and photon density distributions of the two lasers may lead to different mode distributions and hence slightly different sets of emission wavelengths.

Figure 6:
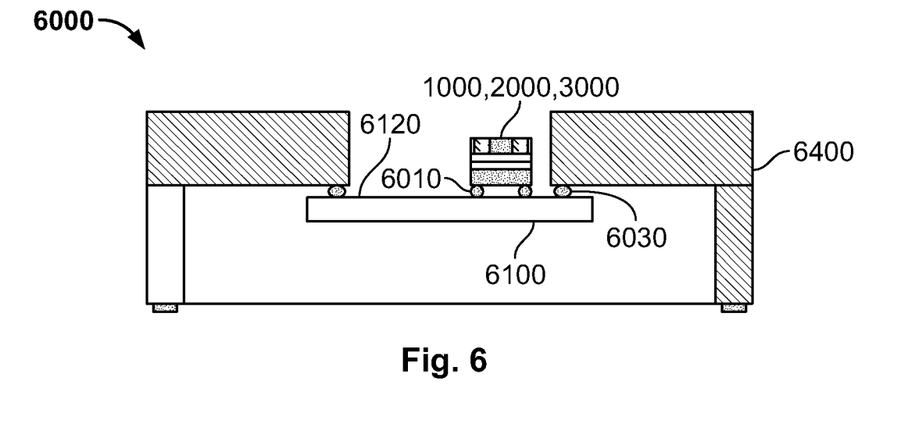
FIG. 6 shows a sectional view of an optical interconnect mounting a lasing device according to the present invention.

FIG. 6 shows in a sectional view an optical module 6000 according to the present invention. The optical module 6000 may be an optical transceiver and may be connected to a circuit carrier, such as a printed circuit board (PCB), a connecting socket or the like, and then used in fiber optical interconnections for midboard applications or as an intra-board or inter-board module. The optical module 6000 includes an optically transparent carrier 6100, on which may be fixed one or more integrated circuits (not shown) or any kind of surface mount component. The optically transparent carrier 6100 may further include one or more lasing devices 1000, 2000, 3000.

The optical transparent carrier 6100 may be made of pyrex glass optically transparent for a defined wavelength, the standard communication wavelength used in midboard applications being 850 nm. However, the transparent carrier may be chosen so as to be transparent to other wavelengths according to the specific application of the optical module. Moreover, alternative to the pyrex glass, other types of optically transparent materials having other optical characteristics may also be used.

The transparent carrier 6100 further includes metal wirings and first electrical connection pads 6030 on a first surface 6120 of the transparent carrier 6100. The first surface 6120 will be also indicated in the following as top surface of the transparent carrier 6100. The lasing device 1000, 2000, 3000 is mounted on the first surface 6120 and is electrically connected to the transparent carrier 6100. The lasing devices 1000, 2000, 3000 may be attached to the transparent carrier 6100 by any kind of known means capable of conducting current, for instance by means of solder bumps 6010. The metal traces included in the transparent carrier 610 connect the lasing devices 1000, 2000, 3000 through the solder bump to the first electrical connection pads or terminals 6030. The electrical connection terminals 6030 may be arranged at the periphery of the transparent carrier 6100. The transparent carrier 6100 is mechanically attached and electrically connected to a carrier substrate 6400.

Although in the particular embodiment described above the lasing devices 1000, 2000, 3000 are mounted on the first surface 6120 of the transparent carrier 6100, they may also be mounted on any other surface of the transparent carrier 6100.

During operation of the optical module 6000, the lasing devices 1000, 2000, 3000, fed by electrical signals through the carrier substrate and the optically transparent carrier, emit light through the optically transparent carrier 6100 towards a bottom surface of the carrier substrate 6400. The emitted light may then be received by an optical coupling element (not shown) and coupled into light guiding elements such as wave guides or the like.

The carrier substrate 6400 is capable to handle high frequency signalling so that the optical module 6000 can be used for high bit rate fibre applications. Moreover, the transparent carrier 6100 and the carrier substrate 6400 are connected according to a flip-chip design.

A further embodiment of the present invention provides a method for forming a lasing device (1000, 2000, 3000) for use in an optical interconnect. The method refers to the lasing devices of FIGS. 1 to 3 and includes forming a first reflector stack (1300, 2300, 3300) on a semiconductor substrate. Subsequently, a cavity spacer (1200, 2200, 3200) is formed on the first reflector stack (1300, 2300, 3300). The cavity spacer includes a first and a second cladding layer and an active layer (1220, 2220, 3220) sandwiched there-between. A confinement layer (1020, 2020, 3020) for confining current within a current-confining aperture (1021, 2021, 3021) is further formed on the second cladding layer. A second reflector stack (1100, 2100, 3100) is formed on the active layer.

The second reflector stack (1100, 2100, 3100) is modified to define a first reflector region (1140, 2140, 3140) arranged on the current-confining aperture and a second mirror region (1130, 2130, 3130) surrounding the first mirror region (1130, 2130, 3130). In particular, the first and second mirror regions may be realized by masking the topmost surface of the second reflector (1100, 2100, 3100) and subsequently etching a shallow surface relief in the second reflector (1100, 2100, 3100). The first mirror region (1130, 2130, 3130) may have the same shape of the current confining aperture but its area is chosen to be larger than the area of the current confining aperture.

In the active layer (1220, 2220, 3220) are defined a main active region (3221) aligned with the current confining aperture and an auxiliary active region (3222) surrounding the main active region. The main active region is larger than the current confining aperture and comprises the zone of the active layer underneath the current confining aperture, into which carriers are directly injected from the p- and n-doped sides, and the region of the active layer immediately surrounding said zone.

In a particular realization of this invention the current-confining aperture may have a diameter of 8 microns. The diameter of the first reflector region may be 11 microns. In another realization, the current-confining aperture may be 10 microns and the diameter of the first reflector region may be 13 microns. The above described configurations are only particular examples and are not to be considered limitative in any way. Indeed, the dimensions of the current-confining aperture and the first reflector region may be chosen to be different than that listed above. The size and shape of the current-confining aperture and the first reflector region may depend on the design and the particular application of the lasing device. More precisely, these values may depend on other parameters of the design and on the characteristics of the materials used, such as the effective background doping of the epitaxial materials used in the cavity spacer and, in particular, the cladding layers. These characteristics are, in turn, very specific to the particular equipment and growth recipes used to produce the different layers. Accordingly, the size of the current confining aperture and of the first reflector region may deviate from the given values.

The method above describes an etching technique for modifying the second reflector (1100, 2100, 3100). However, alternative methods can also be used according to further realizations of the present invention. More precisely, the second mirror region (1130, 2130, 3130) may be formed by growing a further reflector stack on a portion of the second reflector (1100, 2100, 3100) so as to define a relief of the desired shape, which corresponds to the first reflector region. Alternatively, a layer of a highly reflecting material, such as a metallic layer or the like, may be mounted on the second reflector (1100, 2100, 3100).

The second reflector region and the first reflector formed as described above induce stimulated recombination in the auxiliary active region.

The present invention provides a lasing device with an improved response to high-to-low transitions of the bias voltage used in high-bit rate directly modulated optical interconnects.

According to the present invention, an auxiliary laser or guard laser surrounds the main laser, which burns the excess carriers surrounding the active region of the main laser and reduces therefore the capacitive effect of the excess carriers in the active region OF the main laser. This is obtained by providing a resonant cavity surrounding the main laser including reflectors that have a higher reflectivity than the reflectors of the main laser. In this manner, the intensity of the optical field in the area of the active layer surrounding the main laser can be increased so as to increase the rate of stimulated recombination at the periphery of the main laser, thereby burning the excess carriers. The solution described above with reference to FIGS. 1 to 6, allows to produce at low cost and with an easy design a lasing device and optical modules capable of supporting a high modulation bandwidth for 25 Gb/s and higher bitrates applications.

The invention claimed is:

1. A lasing device for use in an optical interconnect, the lasing device comprising:
   a first reflector and a second reflector;
   a confinement layer, said confinement layer being adapted to confine current within a current-confining aperture;
   an active layer between the first and second reflectors, said active layer comprising a main active region aligned with the current confining aperture and an auxiliary active region surrounding the main active region and overlapping the periphery of the main active region, the auxiliary active region being a zone of the active layer including carriers that leaked from the main active region;
   wherein the confinement layer is between the active layer and the second reflector and wherein the second reflector includes a first reflector region arranged on the current-confining aperture and a second reflector region surrounding the first reflector region, the first reflector region, the main active region and the first reflector defining a main laser;
   wherein the second reflector region, the auxiliary active region and the first reflector define an auxiliary laser; and
   wherein the second reflector region and the first reflector, are configured to induce stimulated recombination in the auxiliary active region so that a carrier density is clamped within the auxiliary active region and additional stimulated recombination is induced at the periphery of the main active region, wherein a reflectance of second reflector region is higher than a reflectance of the first reflector region.

2. The lasing device of claim 1, wherein the first reflector region is aligned with the current confining aperture and the area of the first reflector region is larger than the area of the current confining aperture.

3. The lasing device of claim 1, wherein the ratio $S_1/S_0$ between the area of the first reflector region and the area of the current confining aperture is in the range from 1.0 to 3.3.

4. The lasing device of claim 1, wherein the first reflector and the second reflector respectively include at least one reflector layer with high refractive index and one reflector layer with low refractive index.

5. The lasing device of claim 4, wherein a layer of the second reflector is thicker in the second reflector region.

6. The lasing device of claim 4, wherein the thickness of a topmost reflector layer of the second reflector is an odd-number of quarter wavelength in the second reflector region, and zero or an even number of quarter wavelength in the first reflector region.

7. The lasing device of claim 1, wherein the second reflector includes a reflector element arranged on the second reflector region, said reflector element being adapted to increase the reflectance of the second reflector region.

8. The lasing device of claim 1, further including a first cladding layer and a second cladding layer, the active layer being sandwiched between the first and second cladding layers so as to form a cavity spacer, wherein
the length of the cavity spacer is chosen so as to correspond to an integer number of half waves at the emission wavelength.

9. The lasing device of claim 1, wherein the active layer includes a stack of a plurality of alternating quantum wells and barriers and a confinement layer on either side thereof.

10. The lasing device of claims 1, wherein the confinement layer is arranged between the first reflector and the second reflector and includes an oxidized layer of semiconductor or an ion implanted region surrounding the current-confinement aperture.

11. The lasing device of claim 1, wherein the first reflector region is disk-shaped and the second reflector region is ring-shaped.

12. An optical module including the lasing device of claim 1.

13. A method for forming a lasing device for use in an optical interconnect, the method including:
forming a first reflector on a semiconductor substrate;
forming a confinement layer, said confinement layer being adapted to confine current within a current-confining aperture,
forming an active layer aligned with the current confining aperture and an auxiliary active region surrounding the main active region;
forming a second reflector above the active layer and above the confinement layer; the second reflector includes a first reflector region arranged on the current-confining aperture and a second reflector region surrounding the first reflector region, wherein a reflectance of second reflector region is higher than a reflectance of the first reflector region;
defining a main laser from the first reflector region, the main active region and the first reflector;
defining an auxiliary laser from the second reflector region, the auxiliary active region and the first reflector; and
wherein the second reflector region and the first reflector, are configured to induce stimulated recombination in the auxiliary active region so that a carrier density is clamped within the auxiliary active region and additional stimulated recombination is induced at the periphery of the main active region.

* * * * *